United States Patent
Lee et al.

(10) Patent No.: US 8,076,704 B2
(45) Date of Patent: Dec. 13, 2011

(54) ORGANIC LIGHT EMITTING DEVICE AND MANUFACTURING METHOD THEREOF

(75) Inventors: Baek-Woon Lee, Yongin-si (KR); Young-In Hwang, Daegu (KR)

(73) Assignee: Samsung Electronics Co., Ltd. (KR)

( * ) Notice: Subject to any disclaimer, the term of this patent is extended or adjusted under 35 U.S.C. 154(b) by 270 days.

(21) Appl. No.: 12/154,934

(22) Filed: May 27, 2008

(65) Prior Publication Data

US 2009/0026446 A1 Jan. 29, 2009

(30) Foreign Application Priority Data

Jul. 27, 2007 (KR) .......................... 10-2007-0075823

(51) Int. Cl.
*H01L 31/062* (2006.01)

(52) U.S. Cl. ...... 257/294; 257/439; 257/443; 257/E27.1; 257/E29.117; 438/149; 349/42; 349/61; 313/495; 313/582

(58) Field of Classification Search .................. 257/291, 257/292, 294, 439, 443, E51.005, E27.1, 257/E29.112, E29.117, E29.151, E29.147, 257/E29.202, E29.273; 349/61–65, 83; 313/495–498, 582–587; 438/149

See application file for complete search history.

(56) References Cited

U.S. PATENT DOCUMENTS

| 5,880,797 | A  | * | 3/1999 | Yamada et al. | 349/84 |
| 6,757,037 | B2 | * | 6/2004 | Matsuo et al. | 349/113 |
| 6,784,959 | B2 | * | 8/2004 | Noritake | 349/113 |
| 6,947,107 | B2 | * | 9/2005 | Yoshii et al. | 349/113 |
| 2005/0280362 | A1 | * | 12/2005 | Shore et al. | 313/506 |
| 2008/0024402 | A1 | * | 1/2008 | Nishikawa et al. | 345/82 |

\* cited by examiner

*Primary Examiner* — Khiem D Nguyen
*Assistant Examiner* — Su Kim
(74) *Attorney, Agent, or Firm* — Innovation Counsel LLP

(57) ABSTRACT

An organic light emitting device according to an embodiment includes a thin film transistor substrate including a plurality of thin film transistors and an over-coating film formed on the thin film transistors. The over-coating film includes a curved surface on at least two pixels among pixels of different colors and the slope angles of depressed portions forming the curved surface are respectively different from each other depending on the colors of the pixels. A plurality of first electrodes formed on the over-coating film includes a surface formed according to the curved surface, an organic light emitting member formed on the first electrodes includes a surface formed according to the curved surface, and a second electrode formed on the organic light emitting member includes a surface formed according to the curved surface. Slope angles of the depressed portions increase according to a decrease of wavelengths of the colors of the pixels.

27 Claims, 14 Drawing Sheets

FIG.2

| G | B | R | G | B |
|---|---|---|---|---|
| B | R | G | B | R |
| R | G | B | R | G |
| G | B | R | G | B |
| B | R | G | B | R |

FIG.17

| B | W | B | W | B |
|---|---|---|---|---|
| G | R | G | R | G |
| B | W | B | W | B |
| G | R | G | R | G |
| B | W | B | W | B |

ORGANIC LIGHT EMITTING DEVICE AND MANUFACTURING METHOD THEREOF

CROSS-REFERENCE TO RELATED APPLICATION

This application claims priority to and the benefit of Korean Patent Application No. 10-2007-0075823 filed in the Korean Intellectual Property Office on Jul. 27, 2007, the entire contents of which are incorporated herein by reference.

TECHNICAL FIELD

Embodiments of the present invention relate to an organic light emitting device and a method for manufacturing the same for improving efficiency and color reproducibility.

BACKGROUND

The organic light emitting device (OLED) includes a pixel electrode, a common electrode, and an organic light emitting member formed therebetween.

In this organic light emitting device, electrons injected from a cathode electrode and holes injected from an anode electrode are coupled at an emitting layer of an organic light emitting member, and excitons are thereby formed. The formed excitons emit light while discharging energy.

Accordingly, since the OLED does not require an additional light source, the power consumption of the OLED is low. Also, the OLED has a fast response speed, a wide viewing angle, and a superior contrast ratio.

The OLED may be classified as a passive matrix OLED and an active matrix OLED according to a driving type.

Among them, the active matrix OLED, which has thin film transistors as switching elements and driving elements for individually driving each pixel, may be advantageous in the aspects of high resolution, power consumption, and the capacity to be produced with a large size.

Also, the organic light emitting device may be classified as a top emission OLED and a bottom emission OLED according to emission type.

Among them, in terms of schematic structure, the bottom emission organic light emitting device includes a thin film transistor array panel. The thin film transistor array panel includes a plurality of thin film transistors connected to first signal lines and second signal lines, a plurality of color filters formed on the thin film transistors, and an over-coating film covering the color filters.

Also, first electrodes made of indium tin oxide (ITO) or indium zinc oxide (IZO) are formed on the over-coating film, a partition having openings exposing a portion of each first electrode is formed on the first electrodes, and an emitting layer and a second electrode are sequentially formed on the first electrodes in the openings.

In the bottom emission organic light emitting device, a technique in which protrusions and depressions are formed in the surface of the over-coating film has recently been developed. In this structure of the bottom emission organic light emitting device, light loss by total reflection may be reduced on the interface surface between the first electrodes and the over-coating film to thereby increase light extracting efficiency. Also, the area of the light emitting member is increased, thereby reducing current density.

On the other hand, reflection is generated in the interface surface between the first electrodes and the over-coating film due to a difference in refractive indexes of the first electrodes and the over-coating film such that a micro-cavity effect is generated in the bottom emission organic light emitting device.

For example, when forming the first electrodes made of IZO, and the over-coating film made of polyacrylate, the refractive index of the first electrodes is about 2.0 but the refractive index of the over-coating film is about 1.5. Therefore, reflection is generated in the interface surface between the first electrodes and the over-coating film.

The micro-cavity effect is a phenomenon in which light of a predetermined wavelength is enhanced due to constructive interference generated in a micro-cavity where a space is formed between two reflection surfaces for reflecting the light. In the bottom emission organic light emitting device, a space from the interface surface between the first electrodes and the over-coating film to the second electrode is the micro-cavity.

Here, the wavelength that is enhanced in the micro-cavity is proportional to the length of the micro-cavity. Accordingly, to enhance the color red that has a relatively longer wavelength than the color blue, it is preferable that the length of a micro-cavity provided in a red pixel is larger than the length of a micro-cavity provided in the blue pixel.

To achieve this objective, different lengths of micro-cavities are formed according to different colors by controlling the thickness of the over-coating film or the first electrodes according to the emitting type of the display device.

However, additional processes to form the different lengths of the micro-cavity according to the colors are needed such that the manufacturing cost when implementing the additional processes is increased.

The above information disclosed in this Background section is only for enhancement of understanding of the background of the invention and therefore it may contain information that does not form the prior art that is already known in this country to a person of ordinary skill in the art.

SUMMARY OF THE INVENTION

Accordingly, embodiments of the present disclosure provide an organic light emitting device and a method for manufacturing the same having improved efficiency and color reproducibility by gaining an optimized path difference with simplified manufacturing processes.

An organic light emitting device according to an exemplary embodiment of the present disclosure includes: a thin film transistor substrate including a plurality of thin film transistors; an over-coating film formed on the thin film transistors, wherein the over-coating film includes a curved surface on at least two pixels among pixels of different colors, and the slope angle of the depressed portions forming the curved surfaces are respectively different from each other depending on the color of the pixels; a plurality of first electrodes formed on the over-coating film and including a surface formed according to the curved surface; an organic light emitting member formed on the first electrodes and including a surface formed according to the curved surface; and a second electrode formed on the organic light emitting member and including a surface formed according to the curved surface.

The slope angles of the depressed portions may be increased according to a decrease of the wavelengths of the color of the pixel.

When the slope angle of the depressed portion formed in a red pixel is $\theta_R$, the slope angle of the depressed portion formed in a green red pixel is $\theta_G$, and the slope angle of the depressed portion formed in a blue pixel blue pixel is $\theta_B$, the slope angles of the depressed portions may satisfy the condition of $\theta_R \langle \theta_G \langle \theta_B$.

The depressed portions may be only disposed in the green pixel and the blue pixel.

When the size of the depressed portion of the red pixel is $W_R$, the size of the depressed portion of the green pixel is $W_G$, and the size of the depressed portion of the blue pixel is $W_B$, the sizes of the depressed portions may satisfy the condition of $W_R \langle W_G \langle W_B$.

The depressed portions may be only formed in the green pixel and the blue pixel.

When the depth of the depressed portion of the red pixel is $D_R$, the depth of the depressed portion of the green pixel is $D_G$, and the depth of the depressed portion of the blue pixel is $D_B$, the depths of the depressed portions may satisfy the condition of $D_R \langle D_G \langle D_B$, and the sizes of the depressed portions may be the same regardless of color.

The depressed portions may be only formed in the green pixel and the blue pixel.

The organic light emitting device including these elements may be adapted to a bottom emission type or a top emission type.

In the organic light emitting device of the bottom emission type, the first electrodes may be made of a transparent electrode material and the second electrode may be made of a reflective electrode material.

At least one semi-transparent member may be formed between the first electrodes and the over-coating film. The semi-transparent member may include Ag or AgMg, or the semi-transparent member may include insulating materials having the difference of refractive indexes, wherein the insulating materials having the difference of refractive indexes are alternately deposited. The semi-transparent member may include SiNx/SiO$_2$/SiNx/SiO$_2$ sequentially deposited on the over-coating film.

At least one color filter may be formed between the over-coating film and the thin film transistors.

In the organic light emitting device of the top emission type, the first electrodes and the second electrode may be made of a transparent electrode material.

At least one semi-transparent member may be formed between the first electrodes and the over-coating film. The semi-transparent member includes Ag or AgMg, or the semi-transparent member may include insulating materials having the difference of refractive indexes, wherein the insulating materials having the difference of refractive indexes are alternately deposited. The semi-transparent member may include SiNx/SiO$_2$/SiNx/SiO$_2$ sequentially deposited on the over-coating film.

A passivation layer may be formed on the second electrode, and at least one color filter may be formed on the passivation layer.

A method for manufacturing a organic light emitting device according to the present disclosure includes forming lower formations including thin film transistors on a substrate, forming an over-coating film having a curved surface on the lower formations, forming first electrodes according to the curved surface on the over-coating film, forming an organic light emitting member according the curved surface on the first electrodes, and forming a second electrode according to the curved surface on the organic light emitting member, wherein the over-coating film includes a curved surface on at least two pixels among pixels of different colors, and the slope angle of the depressed portion forming the curved surface are respectively different from each other depending on the colors of the pixels.

The slope angles of the depressed portions forming the curved surface may be differently formed according to the pixel by using a mask including a hole pattern having different size depending on the pixel, or different transmittance depending on the pixel.

The depressed portions may be only disposed on the surface of the over-coating film in the green pixel and the blue pixel.

Also, an organic light emitting device according to the present disclosure includes a substrate, a plurality of first electrodes formed on the substrate, a first organic light emitting member formed on a first group among the first electrodes, and having a first depressed portion, a second organic light emitting member formed on a second group different from the first group among the first electrodes, and having a second depressed portion, and a second electrode formed on the first organic light emitting member and the second organic light emitting member, wherein the slope angle of the first depressed portion is larger than the slope angle of the second depressed portion.

The organic light emitting device may further include a third organic light emitting member formed on a third group that is different from the first group and the second group among the first electrodes, and the first organic light emitting member emits blue light, the second organic light emitting member emits green light, and the third organic light emitting member emits red light.

The organic light emitting device may further include at least one signal line formed on the substrate, at least one thin film transistor formed on the substrate, an over-coating firm covering the signal line and the thin film transistor, having a protrusions and depressions surface forming the first and the second depressed portions, wherein the first and the second depressed portions of the first and the second organic light emitting members are respectively formed due to the surface of the over-coating film.

BRIEF DESCRIPTION OF THE DRAWINGS

FIG. 2 is a schematic diagram showing an arrangement of a plurality of pixels in the organic light emitting device according to an exemplary embodiment of the present disclosure.

FIG. 17 is a layout view showing a plurality of pixels in an organic light emitting device according to another exemplary embodiment of the present disclosure.

DETAILED DESCRIPTION

Figure 1:
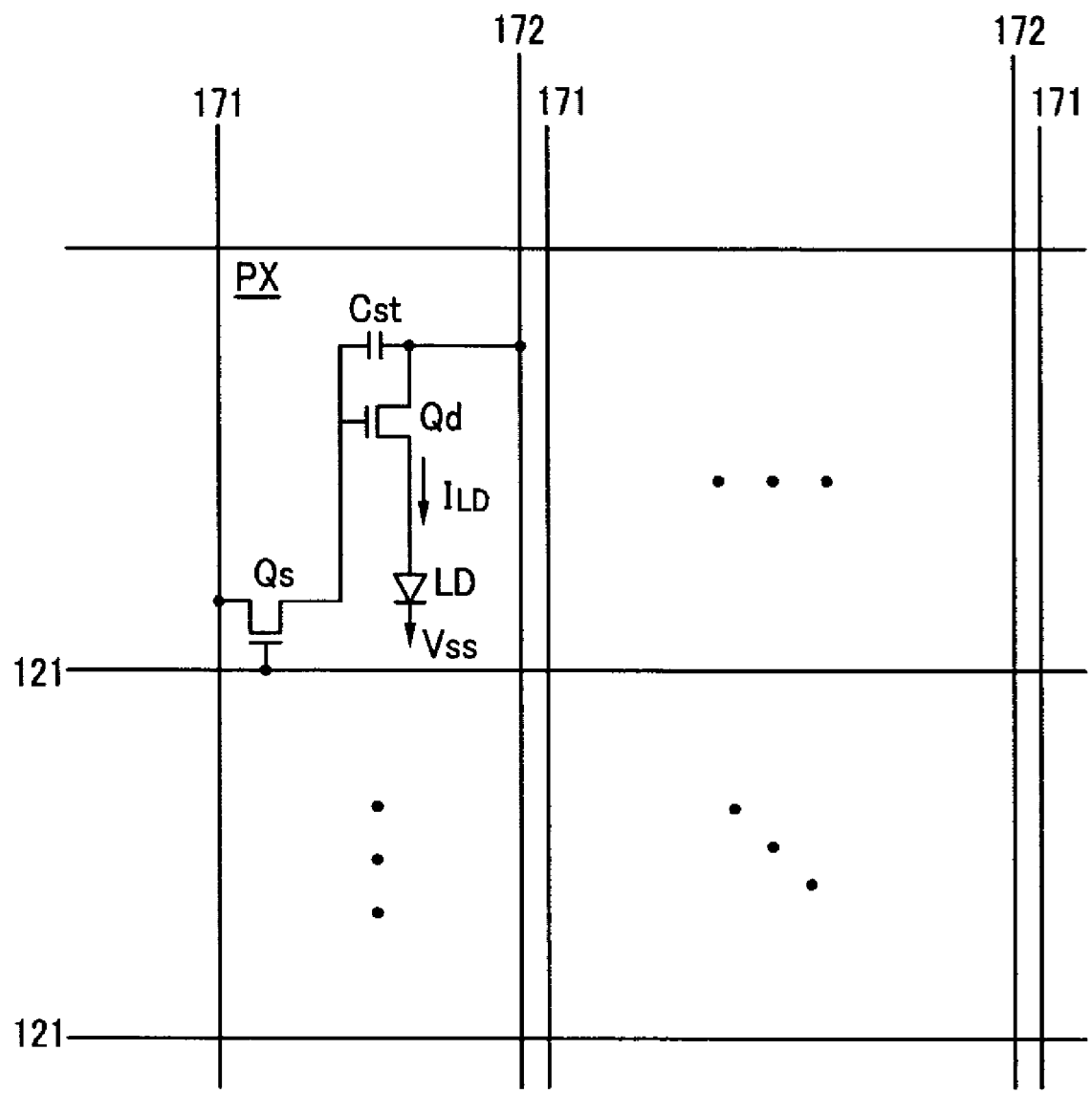
FIG. 1 shows an equivalent circuit of an organic light emitting device according to an exemplary embodiment of the present disclosure.

The present disclosure will be described more fully hereinafter with reference to the accompanying drawings, in which exemplary embodiments are shown. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, an embodiment of an OLED will be described in detail with reference to FIGS. 1 and 2.

Figure 2:
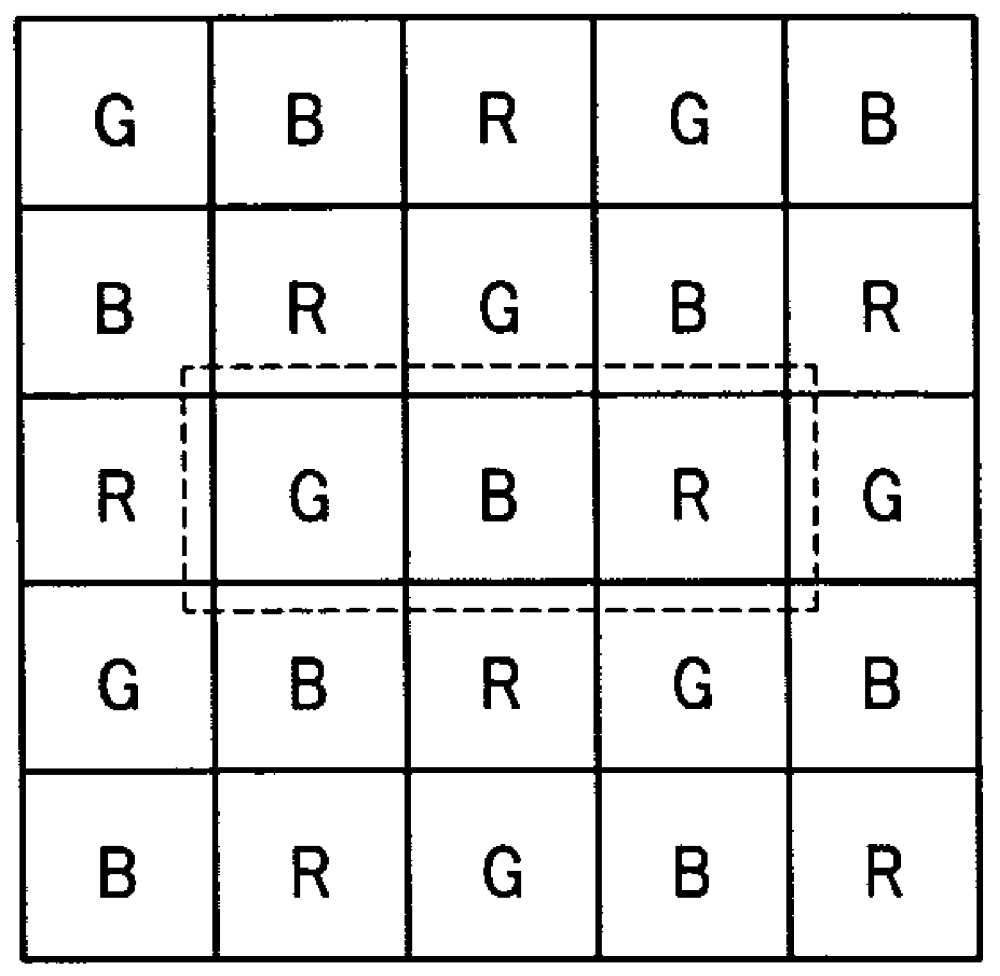

FIG. 1 is an equivalent circuit of an organic light emitting device according to an exemplary embodiment, and FIG. 2 is a schematic diagram showing an arrangement of a plurality of pixels in the organic light emitting device according to an exemplary embodiment.

Referring to FIGS. 1 and 2, an OLED display according to an embodiment includes a plurality of signal lines 121, 171, and 172, and a plurality of pixels PX connected thereto and arranged substantially in a matrix.

The signal lines include a plurality of first signal lines 121 for transmitting gate signals (also called scanning signals), a plurality of second signal lines 171 for transmitting data signals, and a plurality of third signal lines 172 for transmitting a driving voltage.

The first signal lines 121 extend substantially in a row direction and substantially parallel to each other. The second and third signal lines 171 and 172 extend substantially in a column direction and substantially parallel to each other.

Each pixel PX includes a switching transistor Qs, a driving transistor Qd, a capacitor Cst, and an organic light emitting diode LD.

The switching transistor Qs has a control terminal connected to one of the first signal lines 121, an input terminal connected to one of the second signal lines 171, and an output terminal connected to the driving transistor Qd.

The switching transistor Qs transmits the data signals applied to the second signal line 171 to the driving transistor Qd in response to a gate signal applied to the first signal line 121.

The driving transistor Qd has a control terminal connected to the switching transistor Qs, an input terminal connected to the third signal line 172, and an output terminal connected to the organic light emitting diode LD.

The driving transistor Qd drives an output current $I_{LD}$ having a magnitude depending on the voltage between the control terminal and the output terminal thereof, and outputs it to the organic light emitting diode LD.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting diode LD has a first pixel electrode connected to the output terminal of the driving transistor Qd and a second pixel electrode connected to a common voltage Vss. The organic light emitting diode LD emits light having an intensity depending on an output current $I_{LD}$ of the driving transistor Qd, thereby displaying images.

The switching transistor Qs and the driving transistor Qd are n-channel field effect transistors (FETs). However, at least one of the switching transistor Qs and the driving transistor Qd may be a p-channel FET.

In addition, the connections among the transistors Qs and Qd, the capacitor Cst, and the organic light emitting diode LD may be modified.

This organic light emitting device includes a plurality of red pixels R, green pixels G, and blue pixels B, which are sequentially and alternately disposed.

Three pixels of a red pixel R, a green pixel G, and a blue pixel B form one group, and are repeatedly arranged according to rows and/or columns. However, the arrangement and the shape of the pixels may be variously changed.

First Exemplary Embodiment

Now, a detailed structure of the OLED display shown in FIGS. 1 and 2 according to an embodiment of the present disclosure will be described in detail with reference to FIGS. 3-7.

Figure 3:
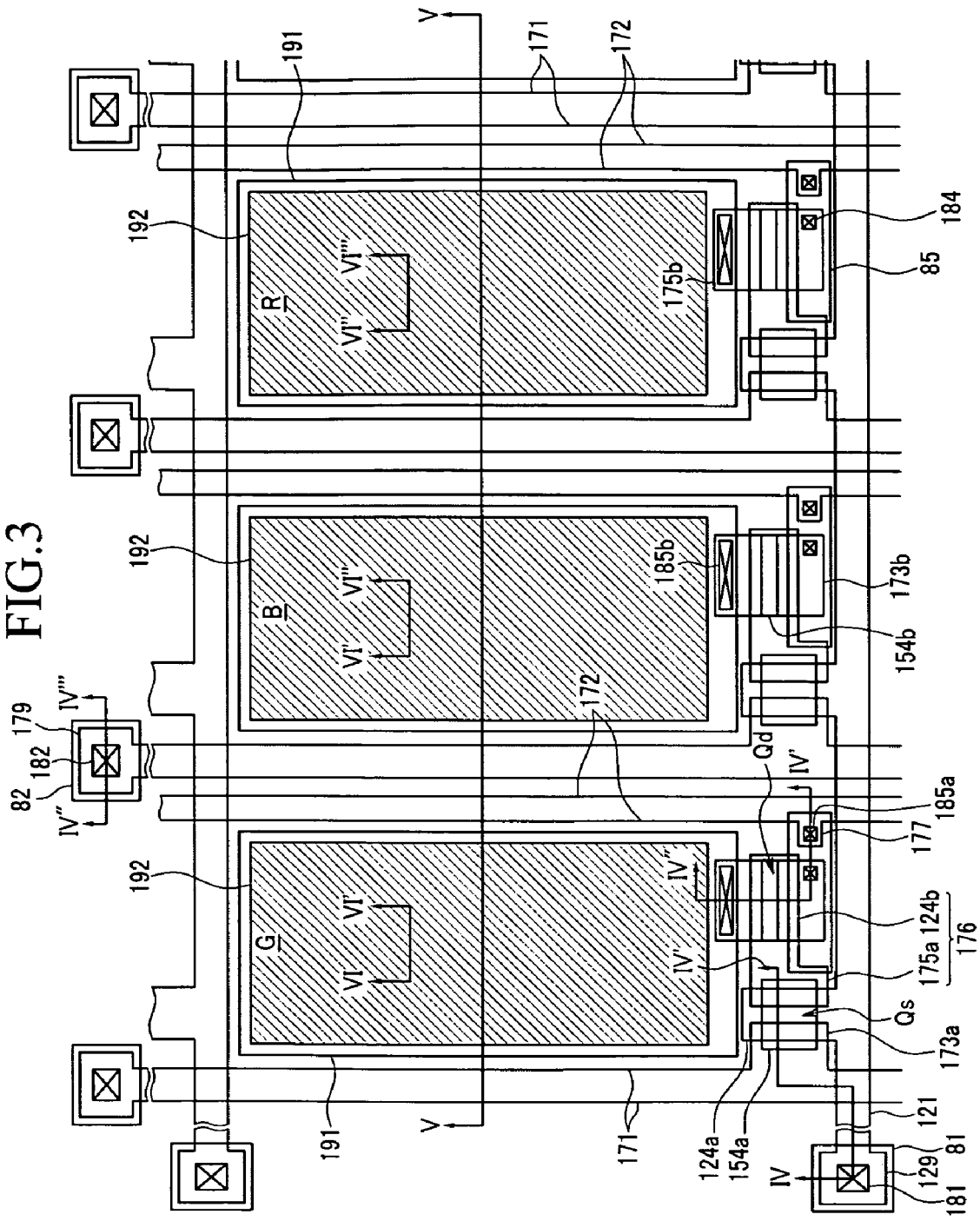
FIG. 3 is a layout view showing three neighboring pixels in the organic light emitting device shown in FIG. 2.
Figure 4:
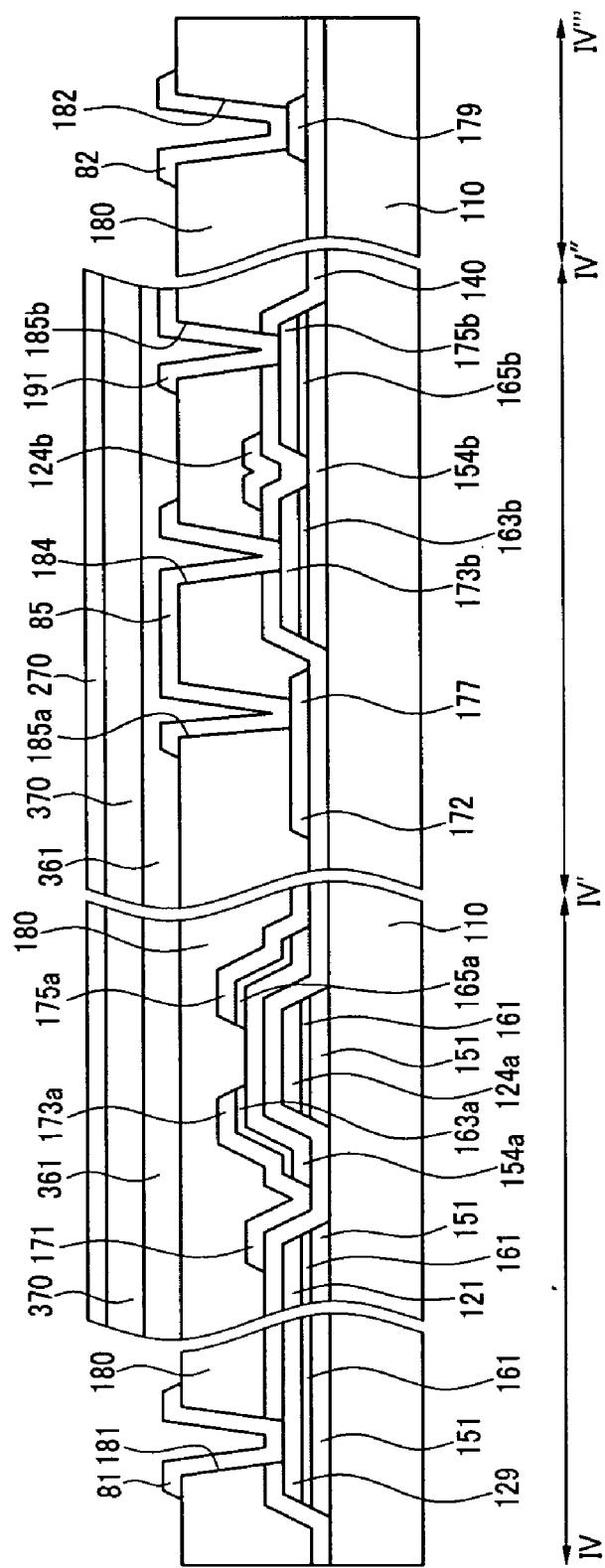
FIG. 4 is a cross-sectional view of the organic light emitting device according to the first exemplary embodiment shown in FIG. 3 taken along the line IV-IV'-IV"-IV"'.

FIG. 3 is a layout view showing the three neighboring pixels in the organic light emitting device shown in FIG. 2, and FIG. 4 is a cross-sectional view of the organic light emitting device according to the first exemplary embodiment shown in FIG. 3 taken along the line IV-IV'-IV"-IV'".

Figure 5:
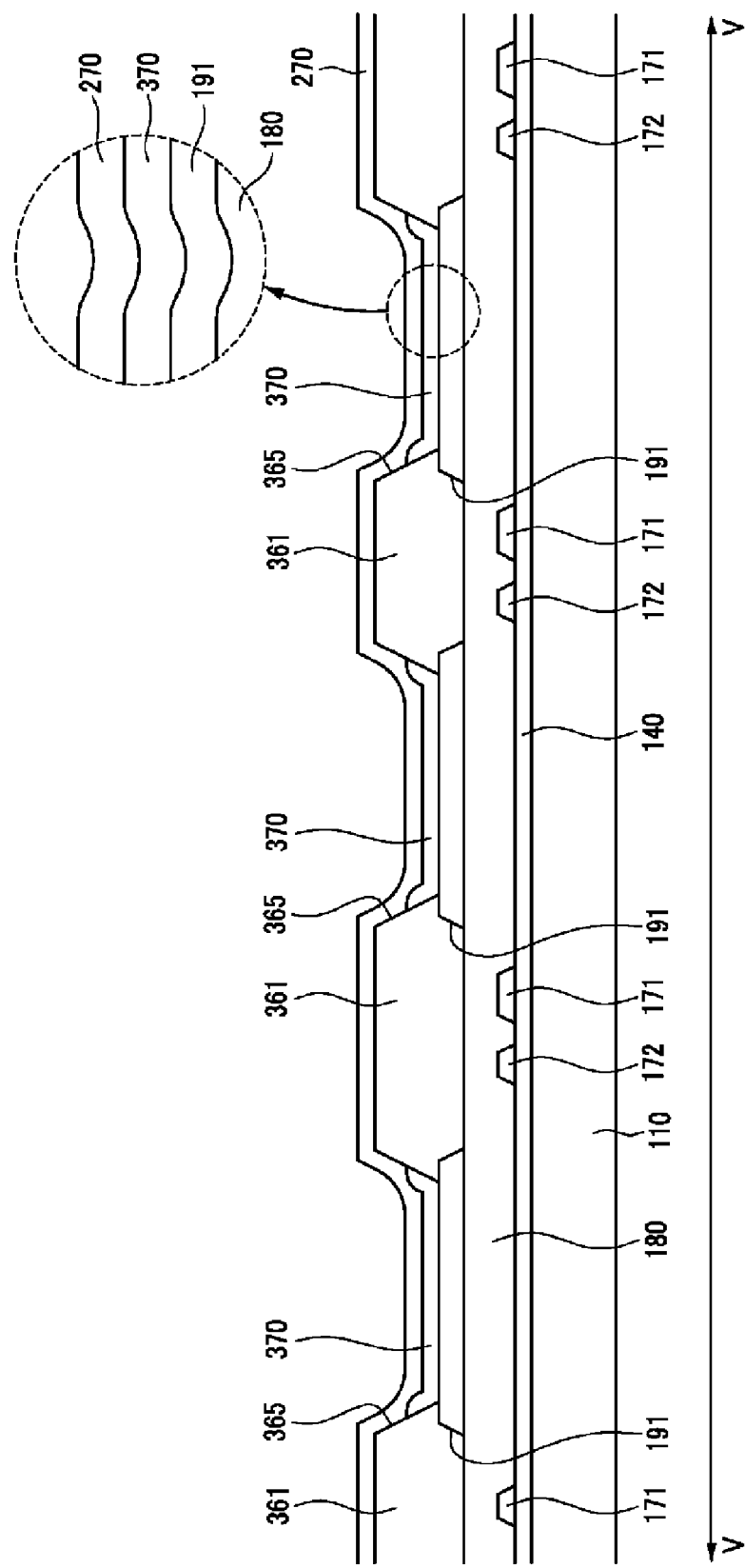
FIG. 5 is a cross-sectional view of the organic light emitting device shown in FIG. 3 taken along the line V-V.
Figure 6:
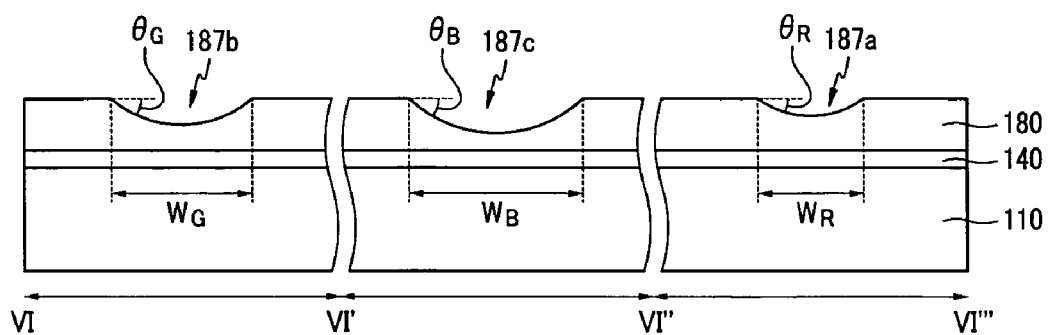
FIG. 6 is a cross-sectional view of the organic light emitting device in FIG. 3 taken along the line VI-VI'-VI"-VI"', in which the semi-transparent member, the pixel electrode, the organic light emitting member, and the common electrode are removed.
Figure 7:
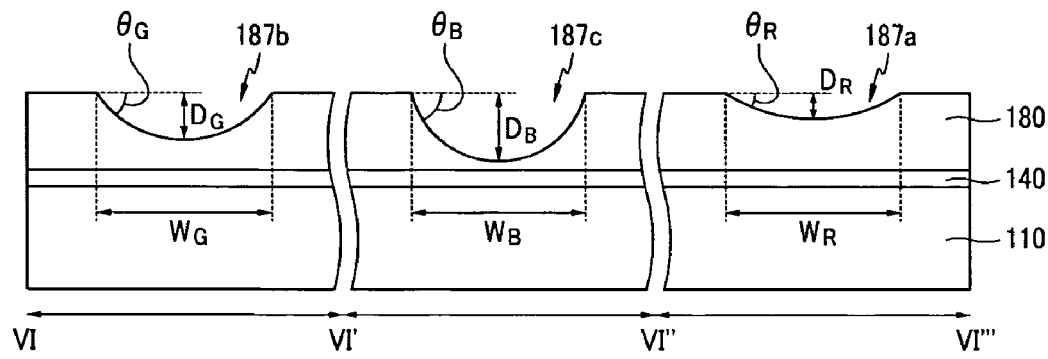
FIG. 7 is a cross-sectional view showing another exemplary embodiment of the depressed portions shown in FIG. 6.

FIG. 5 is a cross-sectional view of the organic light emitting device shown in FIG. 3 taken along the line V-V, FIG. 6 is a cross-sectional view of the organic light emitting device in FIG. 3 taken along the line VI-VI'-VI"-VI'", in which the semi-transparent member, the pixel electrode, the organic light emitting member, and the common electrode are removed, and FIG. 7 is a cross-sectional view showing another exemplary embodiment of the depressed portions shown in FIG. 6.

In FIG. 3, one pixel group indicated by the doted line in the organic light emitting device shown in FIG. 2 is represented. Three pixels include the first signal line 121, the second signal line 171, the third signal line 172, the switching thin film transistor Qs, and the driving thin film transistor Qd, and each have the same structure. Accordingly, the same constituent elements are designated by the same reference numerals.

A plurality of first semiconductor strips 151 and second semiconductor islands 154b are formed on an insulating substrate 110 made of a material such as transparent glass or plastic. The first semiconductor strips 151 are extended in the transverse direction.

The first semiconductor strips 151 and the second semiconductor islands 154b may be made of a semiconductor material such as microcrystalline silicon or polysilicon.

A plurality of the first signal lines 121, a plurality of driving input electrodes 173b, and a plurality of driving output electrodes 175b are formed on the first semiconductor strips 151 and the second semiconductor islands 154b.

The first signal lines 121 transmit gate signals and are substantially extended in the horizontal direction. Each of the first signal lines 121 includes a plurality of switching control electrodes 124a projecting upward from the gate line 121, and an end portion 129 having a large area for contact with another layer or an external driving circuit.

The gate lines 121 may extend to be directly connected to a gate driving circuit (not shown) for generating the gate signals, which may be integrated on the substrate 110.

The first signal lines 121 substantially have the same planer shape as the first semiconductor strips 151.

The driving input electrodes 173b and the driving output electrodes 175b respectively have an island shape, and are separated from the first signal lines 121. The driving input electrodes 173b and the driving output electrodes 175b are opposite to each other on the second semiconductor islands 154b.

The plurality of first signal lines 121 and the plurality of driving input and output electrodes 173b and 175b are preferably made of an Al-containing metal such as Al and an Al alloy, a Ag-containing metal such as Ag and a Ag alloy, a Cu-containing metal such as Cu and Cu alloy, a Mo-containing metal such as Mo and a Mo alloy, Cr, Ta, Ti, etc.

The plurality of first signal lines 121 and the plurality of driving input and output electrodes 173b and 175b may have a multi-layered structure including two films having different physical characteristics.

A plurality of pairs of ohmic contacts 163b and 165b are formed between the second semiconductor islands 154b and the driving input electrodes 173b, and the second semiconductor islands 154b and the driving output electrodes 175b, respectively. Also, a plurality of impurity doping portions 161 are formed between the first signal lines 121 and the first semiconductor strips 151.

The ohmic contacts 163b and 165b and the impurity doping portions 161 are preferably made of a crystalline semiconductor material doped with an impurity such as microcrystalline silicon or polycrystalline silicon heavily doped with an n-type impurity such as phosphorous or arsenic.

A gate insulating layer 140 preferably made of silicon nitride (SiNx) or silicon oxide (SiO$_x$) is formed on the first signal lines 121, the driving input electrodes 173b, and the driving output electrodes 175b. The gate insulating layer 140 may have a signal-layered structure, or a double-layered structure including a first layer of silicon oxide and a second layer of silicon nitride.

A plurality of switching semiconductors 154a preferably made of hydrogenated amorphous silicon is formed on the gate insulating layer 140. The switching semiconductors 154a have an island shape, and overlap the switching control electrodes 124a.

A plurality of the second signal lines 171, a plurality of the third signal lines 172, and a plurality of electrode members 176 are formed on the switching semiconductors 154a and the gate insulating layer 140.

The second signal lines 171 for transmitting data signals extend substantially in the longitudinal direction and intersect the first signal lines 121. Each second signal line 171 includes a plurality of switching input electrodes 173a extended toward the switching control electrodes 124a and an end portion 179 having a large area for contact with another layer or an external driving circuit.

The second signal lines 171 may extend to be directly connected to a data driving circuit (not shown) for generating the data signals, which may be integrated on the substrate 110.

The third signal lines 172 for transmitting driving voltages extend substantially in the longitudinal directional, intersect the first signal lines 121, and are parallel to the second signal lines 171. Each of the third signal lines 172 includes a plurality of protrusions 177.

The electrode members 176 have an island shape, and are separated from the second signal lines 171 and the third signal lines 172. The electrode members 176 each include one portion 175a (hereinafter referred to as a "switching output electrode") opposite to the switching input electrodes 173a, and other portions 124b (hereinafter referred to as a "driving control electrode") overlapping the second semiconductor islands 154b. The switching input electrodes 173a and the switching output electrodes 175a are opposite on the switching semiconductors 154a.

The second signal lines 171, the third signal lines 172, and the electrode members 176 may be made of the same material as that of the first signal line 121, as described above.

A plurality of pairs of ohmic contacts 163a and 165a are respectively formed between the switching semiconductors 154a and the switching input electrodes 173a, and the switching semiconductors 154a and the switching output electrode 175a, respectively.

The ohmic contacts 163a and 165a have an island shape and are preferably made of n+ hydrogenated amorphous silicon heavily doped with an n-type impurity such as phosphorous.

As described above, the switching semiconductors 154a are made of an amorphous semiconductor, and the second semiconductors 154b are made of a crystalline semiconductor. That is to say, the channel of each switching thin film transistor Qs is formed of the amorphous semiconductor, and the channel of each driving thin film transistor Qd is formed of the crystalline semiconductor.

As described above, the switching TFT Qs and the driving TFT Qd of the OLED display according to this embodiment have channels made of different materials such that desired characteristics for the switching TFT and the driving TFT may be satisfied.

That is to say, the channel of the driving thin film transistor Qd is formed of the microcrystalline or polycrystalline semiconductor.

Accordingly, the driving thin film transistor Qd may have carrier mobility and stability, such that the current flowing in the driving thin film transistor Qd may increase to enhance luminance of the OLED. In addition, the so-called threshold voltage shift phenomenon caused by applying a constant positive voltage in driving of an OLED may be prevented such that an image sticking phenomenon is not generated and a reduction of the OLED lifetime does not occur.

Meanwhile, the channel of the switching thin film transistor Qs includes amorphous silicon having a low off current. Accordingly the on/off characteristic of the switching thin film transistor Qs for controlling the data voltage, particularly a reduction of the off current, may be well maintained such that a data voltage reduction due to a high off current may be prevented and the cross-talk phenomenon of the OLED may be reduced.

If the channel of the switching thin film transistor Qs includes microcrystalline silicon or polycrystalline silicon, the off current of the switching thin film transistor Qs may be high enough to reduce the data voltage and to cause the cross-talk phenomenon of the OLED to occur.

Although the OLED display according to this embodiment includes a plurality of pixels having one switching thin film transistor Qs and one driving thin film transistor Qd, other thin film transistors and wiring for driving them may be included to prevent the driving thin film transistor Qd or the organic light emitting diode LD from degrading and the lifetime of the OLED display from being shortened.

An over-coating film 180 is formed on the second signal lines 171, the third signal lines 172, and the electrode members 176. The over-coating film 180 is preferably made of polyacrylate including a photosensitive material. The over-coating film 180 may have a dual-layered structure.

Referring to FIG. 6, the over-coating film 180 has a curved surface. The curved surfaces of depressed portions 187a, 187b, and 187c have different slope angles $\theta$ to the surface of the over-coating film 180 according to the color of the pixels. This is to form different path differences depending on the color of the pixel such that light of a wavelength corresponding to the pixel is enhanced in each pixel.

Here, the slope angles $\theta$ of the curved surfaces of the depressed portions 187a, 187b, and 187c are increased according to a decrease of the wavelength of the color to be displayed.

That is, when the slope angle of the depressed portion 187a formed in the red pixel is $\theta_R$, the slope angle of the depressed portion 187b formed in the green pixel is $\theta_G$, and the slope angle 187c of the depressed portion formed in the blue pixel is $\theta_B$, the slope angles of the depressed portions 187a, 187b, and 187c satisfy the condition of $\theta_R \langle \theta_G \langle \theta_B$.

To form the slope angles $\theta_R$, $\theta_G$, $\theta_B$ of the depressed portions 187a, 187b, and 187c depending on the pixel corresponding to the color, the sizes of the depressed portions are different from each other depending on the color of the pixel.

That is to say, when the size of the depressed portion 187a of the red pixel is $W_R$, the size of the depressed portion 187b of the green pixel is $W_G$, and the size of the depressed portion 187c of the blue pixel is $W_B$, the sizes of the depressed portions 187a, 187b, and 187c satisfy the condition of $W_R \langle W_G \langle W_B$.

Referring to FIG. 7, to form the slope angles $\theta_R$, $\theta_G$, $\theta_B$ of the depressed portions 187a, 187b, and 187c depending on the pixel corresponding to the color, a depth of the depressed portions may be different from each other depending on the color of the pixel. That is to say, when the depth of the depressed portion 187a of the red pixel is $D_R$, the depth of the depressed portion 187b of the green pixel is $D_G$, and the depth of the depressed portion 187c of the blue pixel is $D_B$, the depths of the depressed portions 187a, 187b, and 187c may satisfy the condition of $D_R \langle D_G \langle D_B$. Here, the sizes of the depressed portions 187a, 187b, and 187c are the same regardless of color.

The over-coating film 180 has a plurality of contact holes 185a and 182 respectively exposing the protrusions 177 of the third signal lines 172 and the end portions 179 of the second signal lines 171.

Further, the over-coating film 180 and the gate insulating layer 140 have a plurality of contact holes 181, 184, and 185b respectively, exposing the end portions 129 of the first signal lines 121, the driving input electrodes 173b, and the driving output electrodes 175b.

A plurality of pixel electrodes 191, a plurality of connecting members 85, and a plurality of contact assistants 81 and 82 are formed on the over-coating film 180.

The pixel electrodes 191 are physically and electrically connected to the driving output electrodes 175b through the contact holes, and have a protrusion and depression structure that is formed depending on the curved surface of the over-coating film 180.

The connecting members 85 are respectively connected to the protrusions 177 of the third signal lines 172 and the driving input electrodes 173b through the contact holes 184 and 185a, and form storage capacitors Cst by overlapping the portions of the driving control electrodes 124b.

The contact assistants 81 and 82 are connected to the end portions 129 of the first signal lines 121 and the end portions 179 of the second signal lines 171 through the contact holes 181 and 182, respectively, and they protect the end portions 129 and 179 and enhance the adhesion between the end portions 129 and 179 and external devices.

The pixel electrodes 191, the connecting members 85, and the contact assistants 81 and 82 are preferably made of a transparent conductor such as ITO or IZO.

A partition 361 is formed on the pixel electrodes 191, the connecting members 85, and the contact assistants 81 and 82. The partition 361 surrounds the edges of the pixel electrodes 191 like a bank to define openings 365.

The partition 361 is preferably made of an organic insulating material having a heat-resistance property and solvent resistance property such as acrylic resin and polyimide resin, or an inorganic insulator such as $SiO_2$ and $TiO_2$. Also, the partition 361 may be formed as two or more layers.

The partition 361 may be made of a photosensitive material having a black pigment. In this case, the partition 361 functions as a light blocking member.

A plurality of organic light emitting members 370 are formed on the pixel electrodes 191, and have a protrusion and depression structure that is formed depending on the curved surfaces of the over-coating film 180 and the pixel electrodes 191.

The organic light emitting members 370 may include an auxiliary layer (not shown) for improving the light emitting efficiency as well as an emitting layer (not shown) for emitting light, and the emitting layer includes the material for emitting red, green, and blue light according to the pixel.

In addition, the auxiliary layer may include an electron transport layer (not shown) and a hole transport layer (not shown) for adjusting the balance of electrons and holes, and an electron injecting layer (not shown) and a hole injecting layer (not shown) for enhancing the injection of electrons and holes.

The hole transport layer and the hole injecting layer are preferably made of a material having a HOMO (highest occupied molecular orbital) energy level between the work function of the pixel electrodes 191 and a HOMO energy level of the emitting layer. Also, the electron transport layer and the electron injecting layer are preferably made of a material having a LUMO (lowest unoccupied molecular orbital)

energy level between the work function of the common electrode 270 and the LUMO energy level of the emitting layer.

A common electrode 270 is formed on the organic light emitting members 370. The common electrode 270 is preferably made of a material having a low work function and a high reflectivity. For example, the common electrode 270 may be made of aluminum or an aluminum alloy, or Au, Pt, Ni, Cu, W, or an alloy thereof.

The common electrode 270 is formed on the whole surface of the substrate 110, and has a protrusion and depression structure according to the curved surface of the organic light emitting member 370, which is formed on the pixel electrodes 191.

Also, the common electrode 270 forms a pair with the pixel electrodes 191 to flow the current to the organic light emitting member 370.

For this organic light emitting device, the operation for enhancing the light of the predetermined wavelength according to each pixel will be described in detail with reference to FIGS. 5 to 8.

As above-described, the pixel electrodes 191, the organic light emitting members 370*n* and the common electrode 270 have the same curved surface as the curved surface of the over-coating film 180.

However, the depressed portions 187*a*, 187*b*, and 187*c* forming the curved surface of the over-coating film 180 have different slope angles of $\theta_R$, $\theta_G$, and $\theta_B$. This is to control the light of the predetermined wavelength to be enhanced in each pixel by differently forming the length of the micro-cavity by controlling the slope angles $\theta_R$, $\theta_G$, and $\theta_B$.

The common electrode 270 generates a micro-cavity effect along with the interface surface between the pixel electrode 191 and the over-coating film 180. Here, the common electrode 270 functions as a reflection layer, and the interface surface between the pixel electrode 191 and the over-coating film 180 functions as a semi-transparent layer.

Figure 8:
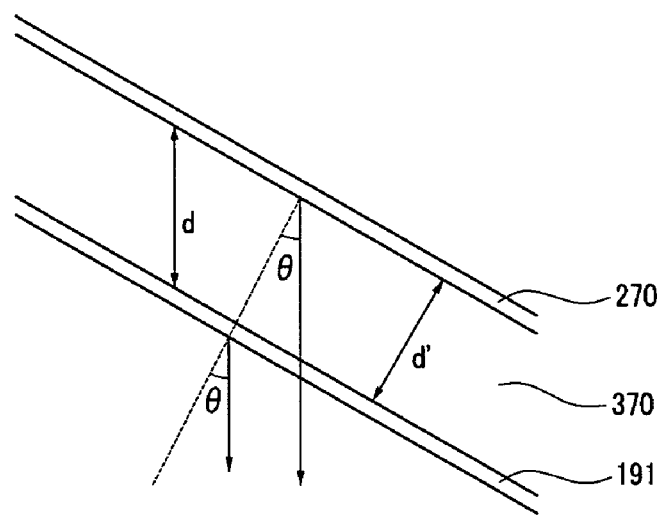
FIG. 8 is a schematic view explaining a principal of enhancing light having a predetermined wavelength in a micro-cavity formed by the depressed portions shown in FIG. 6.

Referring to FIG. 8, the micro-cavity effect occurs when the light is repeatedly reflected between the reflection and the semi-transparent layers, which are spaced from each other by a predetermined distance, to thereby enhance the light of the predetermined wavelength by the constructive interference, and the wavelength condition for enhancing the light in the micro-cavity can be represented with the following Equation 1.

$$\text{Path difference} = 2nd' \cos \theta \quad [1]$$

Here, n is a refractive index of the organic light emitting member, d' is a normal line distance between the interface surface between the pixel electrode and over-coating film, and the common electrode, and $\theta$ is the slope of the depressed portion.

Also, the path difference can be represented with the following Equation 2.

$$\text{Path difference} = \lambda/2 \quad [2]$$

Here, $\lambda$ is the wavelength of the light.

Accordingly, the wavelength $\lambda$ of the light enhanced in the micro-cavity by the constructive interference can be represented with the following Equation 3.

$$\lambda = 4nd' \cos \theta \quad [3]$$

Here, the value of the normal line distance d' in [Equation 1] and [Equation 3] is changed depending on the slope angle $\theta$.

Referring to FIG. 8, the substantial distance of the micro-cavity d' is represented with the following Equation 4.

$$d' = d \cos \theta \quad [4]$$

Accordingly, if Equation 4 is substituted for Equation 3, the wavelength $\lambda$ of the light enhanced in the micro-cavity by the constructive interference can be represented with the following Equation 5.

$$\lambda = 4nd \cos^2 \theta \quad [5]$$

Accordingly, the wavelength $\lambda$ of the light enhanced in the micro-cavity by the constructive interference is proportional to the value of the square of the angle cosine.

Here, the condition of $\lambda_R \rangle \lambda_G \rangle \lambda_B$ is satisfied between the wavelength $\lambda_R$ of red light, the wavelength $\lambda G$ of green light, and the wavelength $\lambda_B$ of blue light.

Accordingly, the slope angles of the depressions 187*a*, 187*b*, and 187*c* formed in each pixel may be controlled to generate the constructive interference for the light of red, green, and blue wavelengths in each pixel.

That is to say, if the slope angles of the depressed portions 187*a*, 187*b*, and 187*c* of each pixel are formed to satisfy the condition of $\theta_R \langle \theta_G \langle \theta_B$, the light of the predetermined color is enhanced.

Next, a method for manufacturing the organic light emitting device including the above-described elements will be explained with reference to FIGS. 5 and 9.

Firstly, a plurality of lower formations is formed on a substrate 110. Here, the lower formations include thin film transistors $Q_S$ and $Q_d$.

A photosensitive insulating material is coated on the lower formations to form an over-coating film 180. Here, the curved surface areas of the over-coating film 180 are formed for the slope angles of the depressed portions 187*a*, 187*b*, and 187*c* in each pixel to satisfy the condition of $\theta_R \langle \theta_G \langle \theta_B$.

Figure 9:
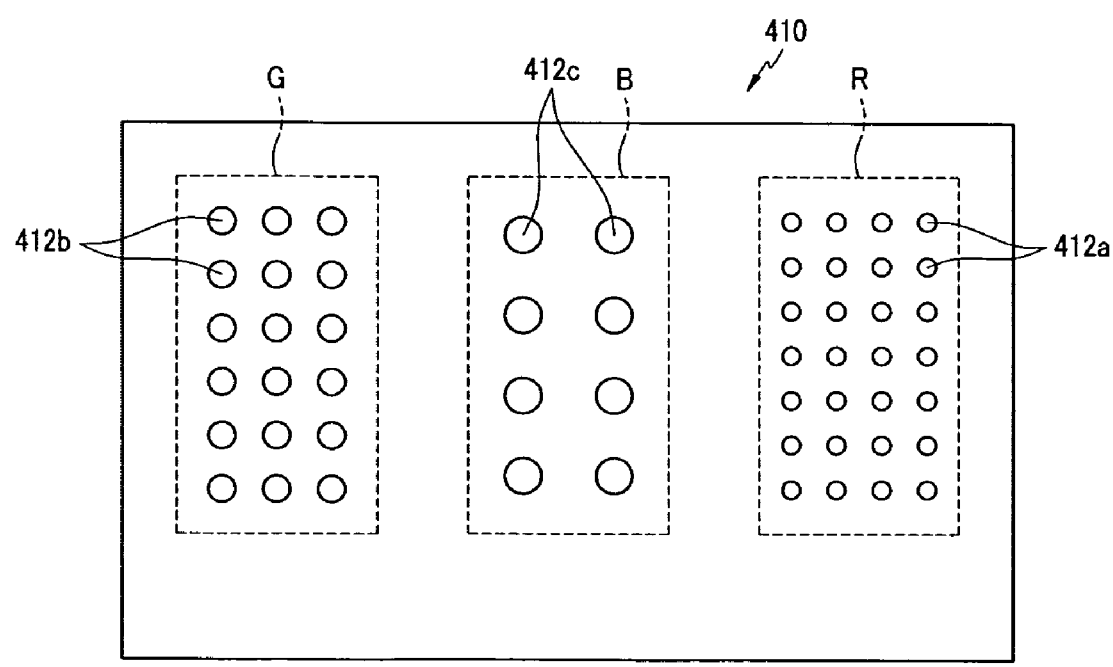
FIG. 9 is a plan view of a mask for forming a curved surface of an over-coating film in the organic light emitting device according to the first exemplary embodiment of the present disclosure.

To obtain this, a mask 410 shown in FIG. 9 is used in the present exemplary embodiment. FIG. 9 shows the mask region corresponding to one pixel group.

To form the depressed portions 187*a*, 187*b*, and 187*c* having the slope angles for satisfying the condition of $\theta_R \langle \theta_G \langle \theta_B$, the mask 410 includes openings 412*a*, 412*b*, and 412*c* having difference sizes.

Since the openings 412*a*, 412*b*, and 412*c* having the difference sizes have different transmittances by which the light of an exposure light source is transmitted, the depressed portions 187*a*, 187*b*, and 187*c* having the different sizes may be respectively formed on the surface of the over-coating film 180.

Accordingly, the over-coating film 180 is exposed and developed using the mask 410 to form the depressed portion 187*a* having the size $W_R$ in the red pixel. Also, the depressed portion 187*b* having the size $W_G$ is formed in the green pixel, and the depressed portion 187*c* having the size $W_B$ is formed in the blue pixel. Here, the sizes satisfy the condition of $W_R \langle W_G \langle W_B$.

A curing process is executed after forming the depressed portions 187*a*, 187*b*, and 187*c*. When the curing process is executed, the curved surface of the over-coating film 180 is smoothed.

In FIG. 9, the mask 410 having the openings 412*a*, 412*b*, and 412*c* with a circular shape is explained as an example, but the openings may have a line shape.

The process for forming the depressed portions is simultaneously executed with the process for forming a plurality of contact holes 185*a*, 182, 181, 184, and 185*b* in the over-coating film 180, or may be separately executed from the process for forming a plurality of contact holes.

Second Exemplary Embodiment

Next, a second exemplary embodiment of the present disclosure will be described with reference to FIGS. 10 to 12.

Figure 10:
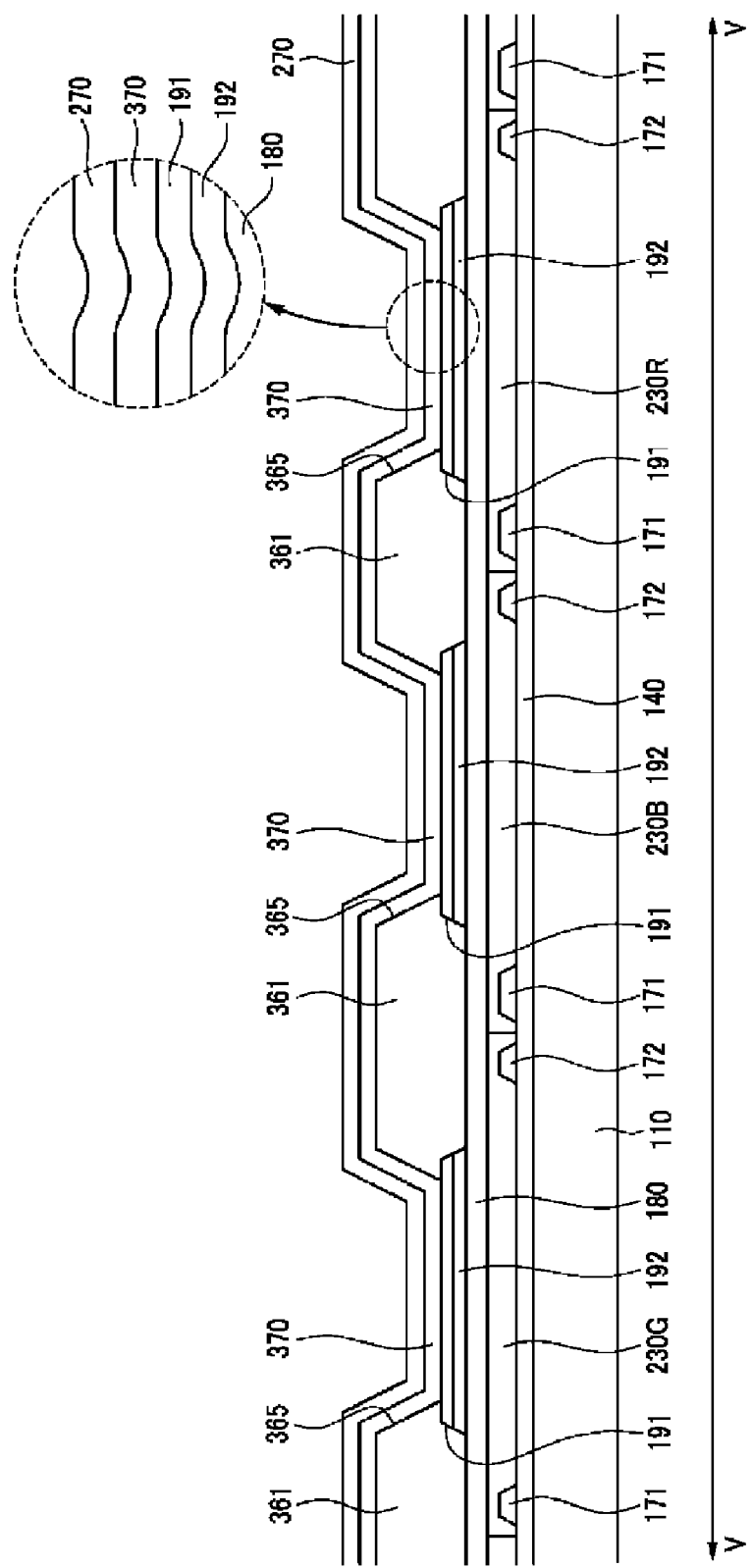
FIG. 10 is a cross-sectional view of the organic light emitting device shown in FIG. 5 according to the second exemplary embodiment of the present disclosure.

FIG. 10 is a cross-sectional view of the organic light emitting device shown in FIG. 5 according to the second exemplary embodiment. A n organic light emitting device further includes a semi-transparent member and a color filter, differently from the first exemplary embodiment.

The organic light emitting device according to the present exemplary embodiment includes color filters 230R, 230G, and 230B to obtain color pixels. The color filters 230R, 230G, and 230B may be disposed as a COA (color filter on array) type. In this case, the color filters 230R, 230G, and 230B are formed under the over-coating film 180.

When a color pixel is provided by using the color filters 230R, 230G, and 230B, the emitting layer may emit white light. For example, materials emitting red, green, and blue lights are sequentially stacked to form a plurality of sub-emitting layers (not shown), and white light may be emitted through the combination of these lights.

Herein, the present forming method is not limited to vertically forming the sub-emitting layers, as the sub-emitting layers may be horizontally formed. Also, the combination of light to emit the white light is not limited to red, green, and blue color light. The sub-emitting layers may be formed with various color combinations that emit the white light.

Furthermore, a plurality of semi-transparent members 192 are formed between the over-coating film 180 and the pixel electrodes 191. The semi-transparent members 192 enhance the reflection of the light to obtain the maximum interference effect, and are preferably made of a material that reflects a portion of the light and passes a portion of the light, and is not particularly limited.

For example, the semi-transparent member 192 is preferably made of a conductor having opaque characteristics and a low absorptive rate such as a Ag alloy like AgMg or Ag, with the thickness of about 10 to 100 Å.

As a different example, the semi-transparent members 192 may be made of insulating materials having large differences of refractive index, for example SiNx/SiO$_2$/SiNx/SiO$_2$ in which SiNx and SiO$_2$ are alternately deposited.

In the present exemplary embodiment, the semi-transparent members 192 are disposed between the over-coating film 180 and the pixel electrodes 191, but the semi-transparent members 192 may be disposed between the pixel electrodes 191 and the organic light emitting members 370.

Also, the semi-transparent members 192 formed on the over-coating film 180 have a protrusion and depression structure depending on the curved surface of the over-coating film 180.

Figure 11:
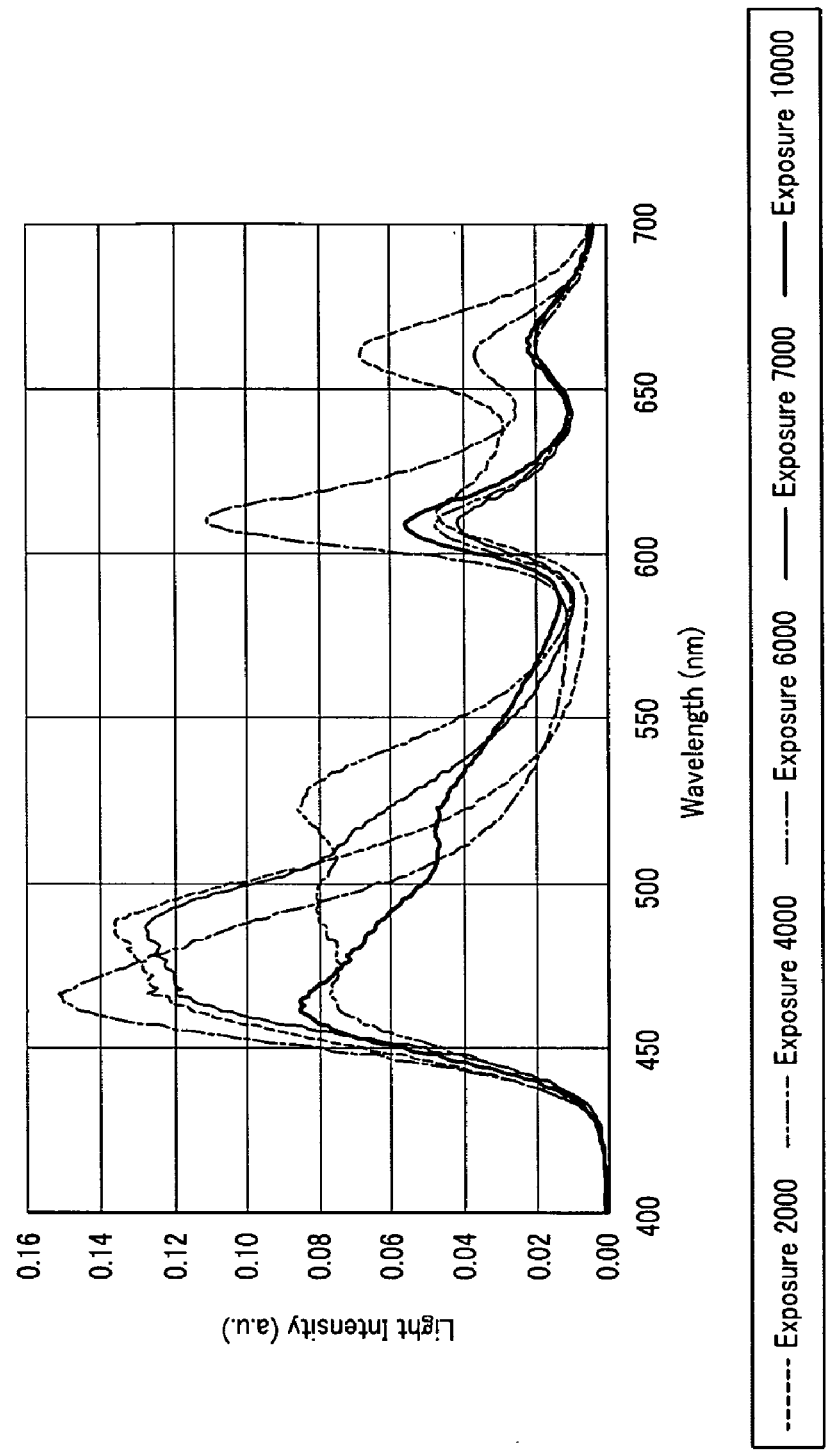
FIG. 11 is a graph showing a spectrum analysis result of the organic light emitting device including only the semi-transparent member without the color filters according to the second exemplary embodiment of the present disclosure.

FIG. 11 is a graph showing a spectrum analysis result of the organic light emitting device including only the semi-transparent member without the color filters according to the second exemplary embodiment of the present disclosure.

Referring to the drawing, peak intensities in each wavelength region are different according to the different conditions depending on an exposure time or an exposure amount. However, if the exposure time or the exposure amount is controlled, the slope angles of the depressed portions may be differently formed from each other. Accordingly, the peak intensities may be obtained in each desired wavelength region by appropriately forming the slope angles of the depressed portions according to each color by controlling the exposure time or the exposure amount.

Figure 12:
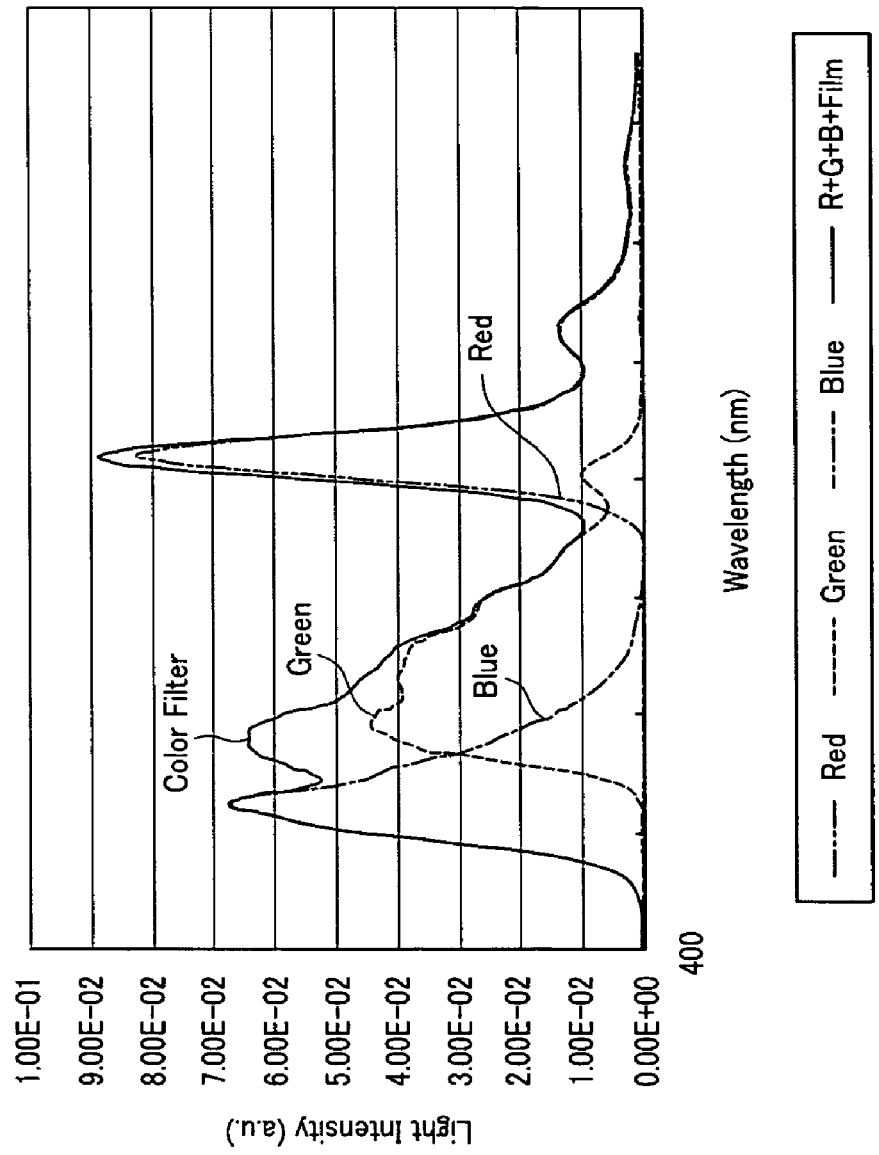
FIG. 12 is a graph showing color reproducibility of the organic light emitting device including the color filter and the semi-transparent member according to the second exemplary embodiment of the present disclosure.

FIG. 12 is a graph showing color reproducibility of the organic light emitting device including both the color filter and the semi-transparent member according to the second exemplary embodiment of the present disclosure, and referring to the drawing, it can be seen that the changes of the colors are generated in the permitted levels.

Third Exemplary Embodiment

Next, the third exemplary embodiment of the present disclosure will be described in detail with reference to FIGS. 13 and 14.

Figure 13:
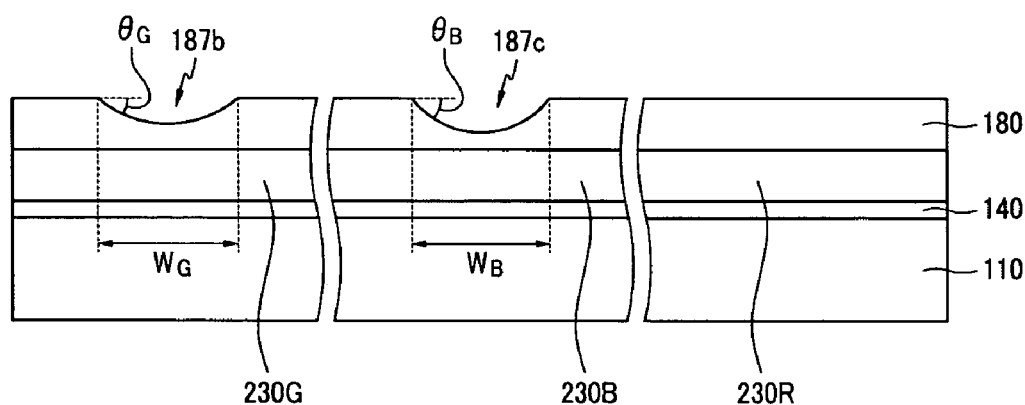
FIG. 13 is a cross-sectional view of the organic light emitting device shown in FIG. 6 according to the third exemplary embodiment of the present disclosure.
Figure 14:
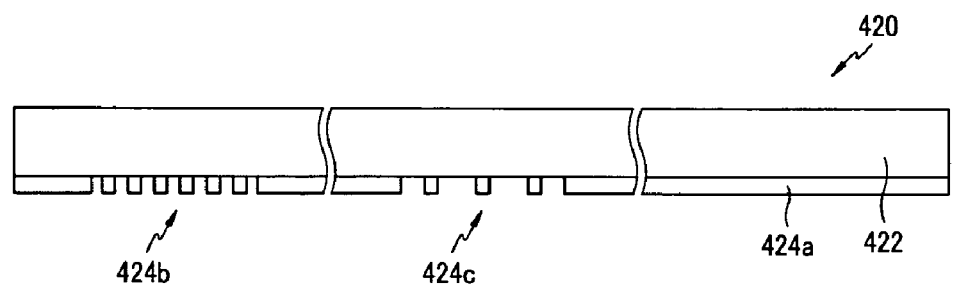
FIG. 14 is a cross-sectional view of a mask for forming a curved surface of the over-coating film of an organic light emitting device according to the third exemplary embodiment of the present disclosure.

FIG. 13 is a cross-sectional view of the organic light emitting device shown in FIG. 6 according to the third exemplary embodiment, and FIG. 14 is a cross-sectional view of a mask for forming a curved surface of the over-coating film of an organic light emitting device according to the third exemplary embodiment.

In the organic light emitting device according to the present exemplary embodiment, an organic light emitting member 370 is formed with the optimized thickness in only a pixel of red wavelength, and the over-coating film 180 has a curved surface in only the green pixel and the blue pixel.

That is to say, the slope angle of the depressed portion disposed on the red color filter 230R of the red pixel is about 0° in the present exemplary embodiment of the organic light emitting device.

Table 1 below represents the slope angle of the depressed portions that are evaluated by substituting the red wavelength, the green wavelength, and the blue wavelength for Equation 5.

TABLE 1

| Color | wavelength(nm) | θ(°) |
|---|---|---|
| Red | 610 | 0 |
| Green | 530 | 21.2 |
| Blue | 460 | 29.7 |

On the other hand, because the depressed portions 187a, 187b, and 187c are formed by using the mask 410 showed in FIG. 9 in the first exemplary embodiment, the sizes of the depressed portions are different from each other according to the pixel.

However, the sizes W$_G$ and W$_B$ of the depressed portions 187b and 187c are the same, regardless of the pixel in the present exemplary embodiment (W$_G$=W$_B$).

The organic light emitting device including these elements may be manufactured by using a mask 420 as shown in FIG. 14.

A light blocking layer 424a is formed on a substrate 422 of the mask 420 in a red pixel region. Also, a light transmitting layer 424b having a first transmittance is formed in a green pixel area, and a light transmitting layer 424c having a second transmittance that is larger than the first transmittance is formed in a blue pixel region.

Only one light transmitting layer is formed on each green pixel area and each blue pixel region in FIG. 14, but a plurality of light transmitting layers are substantially formed.

Next, if the exposure process using the mask 420 is executed, the over-coating layer on the blue pixel region is exposed more than that on the green pixel area, such that the slope angle θ$_B$ of the depressed portion 187c of the over-coating film on the blue pixel region is larger than the slope angle θ$_G$ of the depressed portion 187b of the over-coating film on the green pixel area after developing.

Fourth Exemplary Embodiment

In the cases from the first exemplary embodiment to the third exemplary embodiment, bottom emission types of displays in which the light emitted from the emitting layer is transmitted to the substrate 110 side are explained. However, the present device may be adapted to a top emission type of display in which the light emitted from the emitting layer is transmitted to the side of the common electrode 270.

Figure 15:
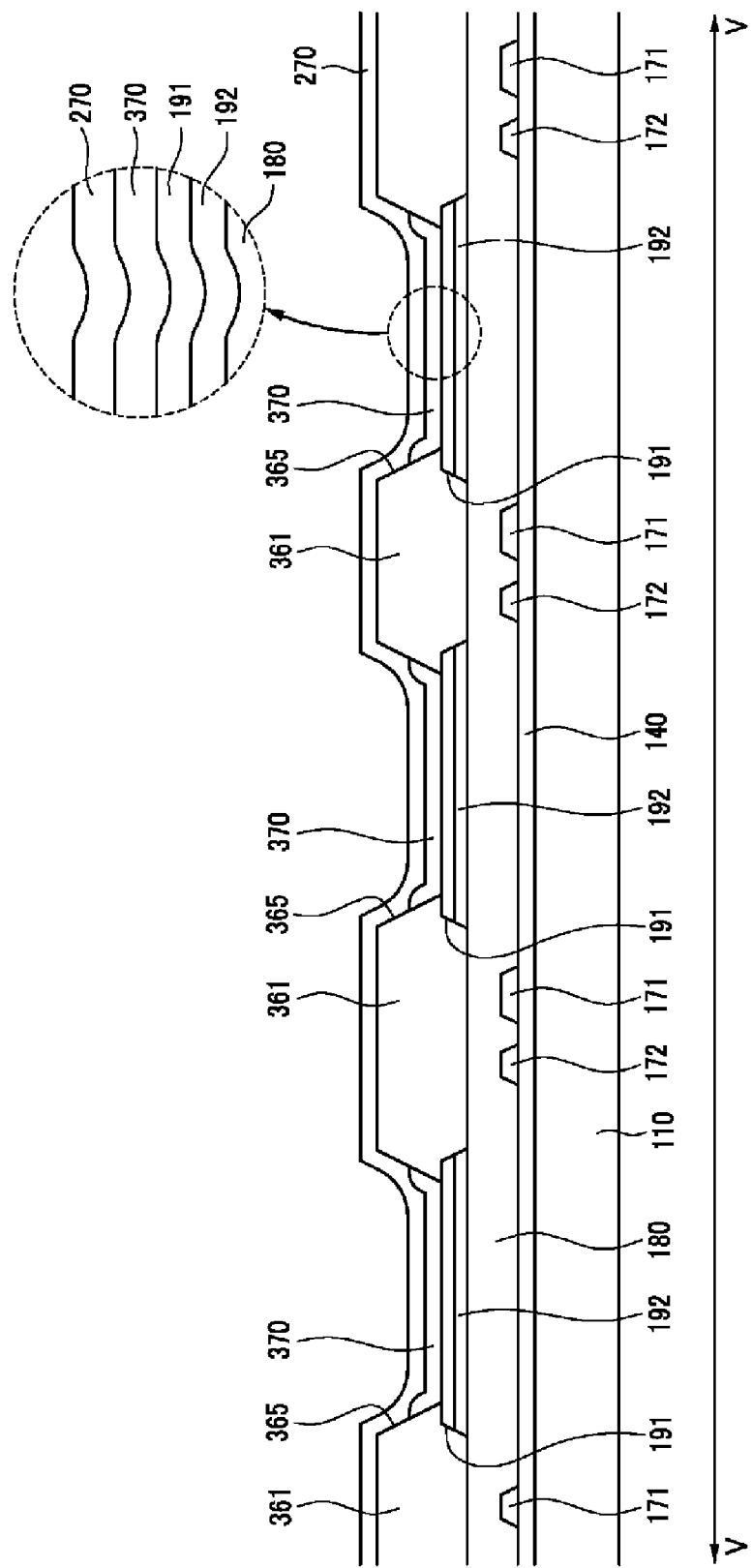
FIG. 15 is a cross-sectional view of a portion corresponding to FIG. 5 in the organic light emitting device according to the fourth exemplary embodiment of the present disclosure.

Next, referring to FIG. 15, the fourth exemplary embodiment of the present disclosure will be described in detail. FIG. 15 is a cross-sectional view of the portion corresponding to FIG. 5 in the organic light emitting device according to the fourth exemplary embodiment.

As shown in FIG. 15, a common electrode 270 is made of a transparent electrode material like the pixel electrodes 191, and semi-transparent members 192 are formed under the pixel electrodes 191 in an organic light emitting device according to the present exemplary embodiment. Further, the rest of the structures are the same as that of the first exemplary embodiment.

Fifth Exemplary Embodiment

Figure 16:
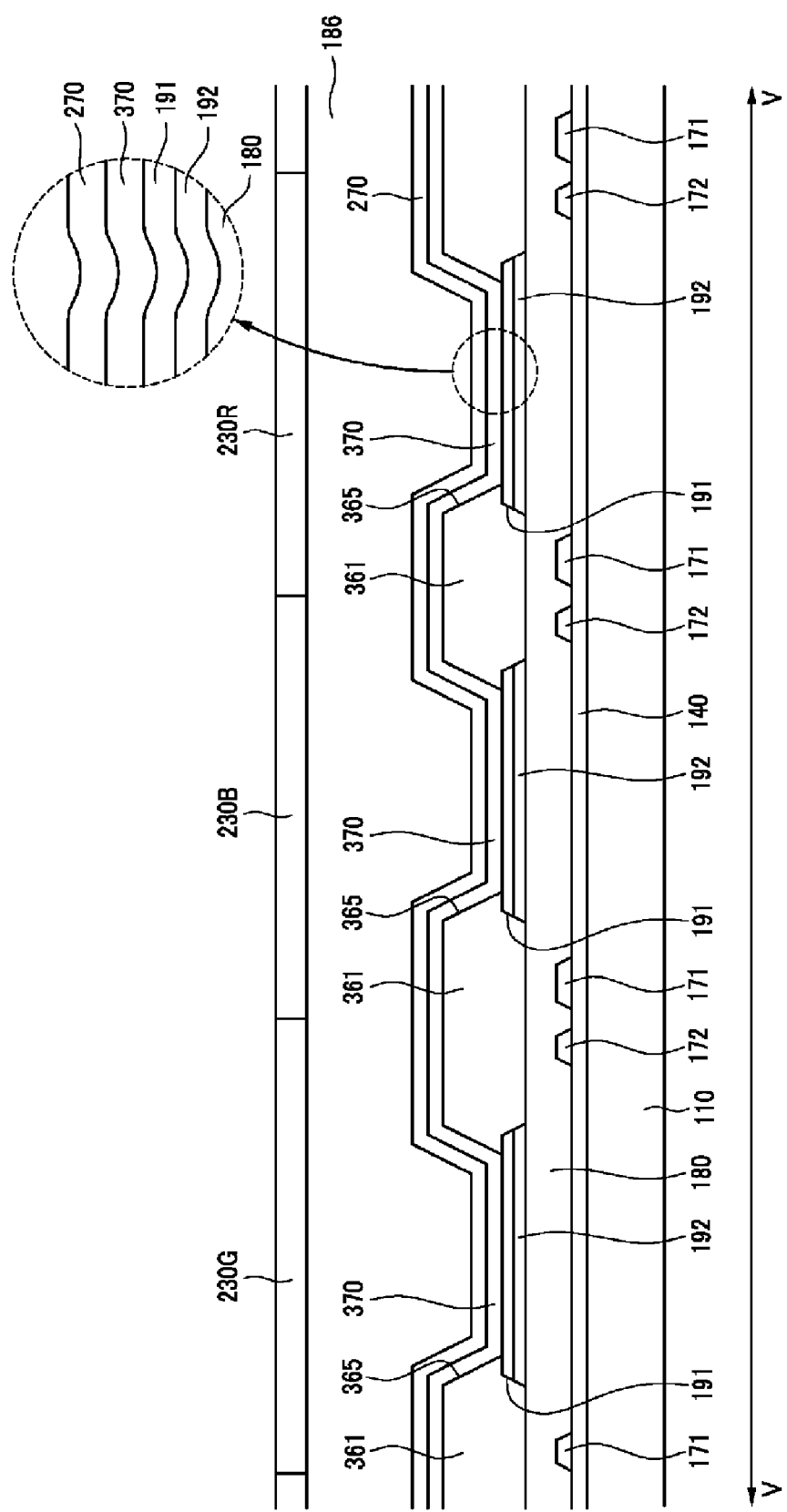
FIG. 16 is a cross-sectional view of a portion corresponding to FIG. 5 in the organic light emitting device according to the fifth exemplary embodiment of the present disclosure.

Next, referring to FIG. 16, the fifth exemplary embodiment of the present disclosure is described in detail. FIG. 16 is a cross-sectional view of the portion corresponding to FIG. 5 in the organic light emitting device according to the fifth exemplary embodiment.

As shown in FIG. 16, a plurality of semi-transparent members 192 and a plurality of pixel electrodes 191 are formed on an over-coating film 180 having a surface with protrusions and depressions, an organic light emitting member 370 is formed on the pixel electrodes 191, and a common electrode 270 is formed on the organic light emitting member 370.

Because the present exemplary embodiment is the top emission type, the common electrode 270 is preferably made of a transparent material such as ITO or IZO, like the pixel electrodes 191. However, when the pixel electrodes 191 are made of a reflective metal, the semi-transparent members 192 may be eliminated.

Next, a passivation layer 186 is formed on the common electrode 270, and color filters 230R, 230G, and 230B are formed on the passivation layer 186.

In this way, when the color pixel is provided by using the color filters 230R, 230G, and 230B, the emitting layer may emit the white light.

Figure 17:
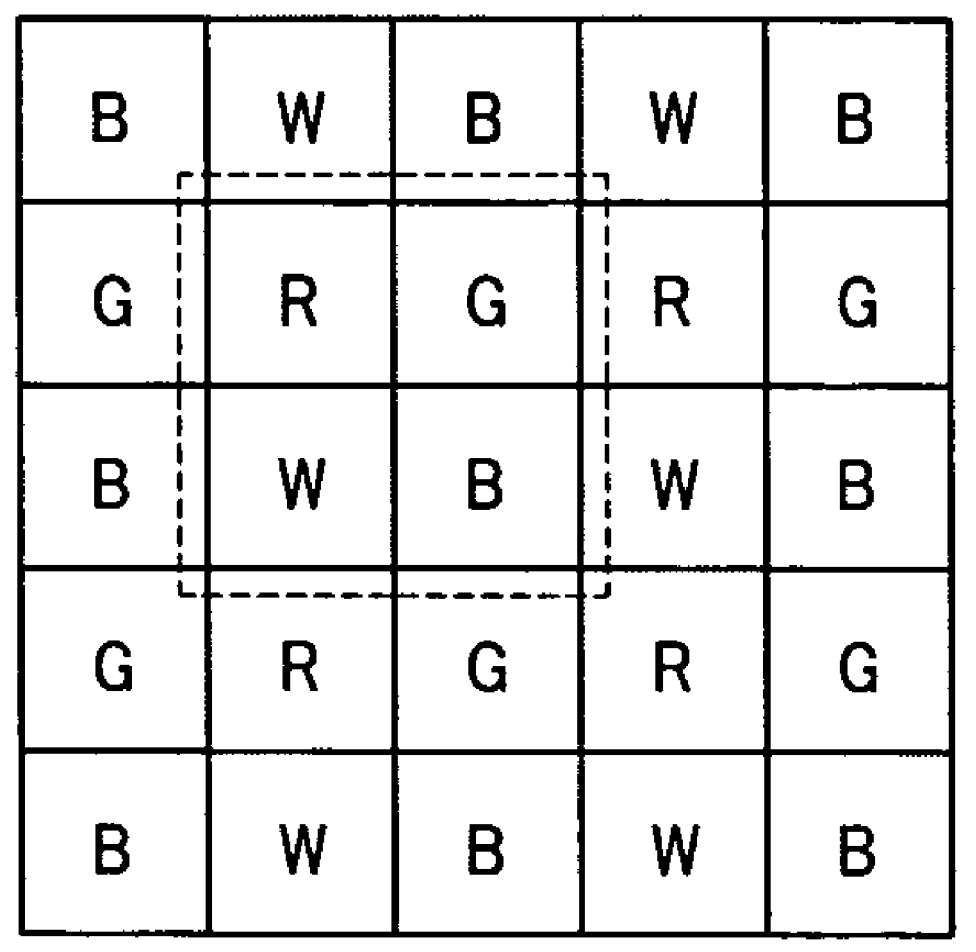

FIG. 17 is a layout view showing a plurality of pixels in an organic light emitting device according to another exemplary embodiment of the present disclosure.

Referring to FIG. 17, a red pixel R for displaying a red color, a green pixel G for displaying a green color, a blue pixel B for displaying a blue color, and a white pixel W for not displaying a single color are alternately and sequentially arranged in an organic light emitting device according to the present exemplary embodiment.

For example, one group is composed of four pixels including the red pixel R, the green pixel G, the blue pixel B, and the white pixel W, which are repeatedly disposed according to row and/or column.

In the organic light emitting device including this pixel structure, the surface with the protrusions and depressions in the white pixel is formed to be extremely curved to cause the light to be diffusely reflected, thereby removing the interference effect. Also, it is preferable that the surface of the over-coating film on the white pixel is formed to be flattened, and the semi-transparent members are not formed to thereby reduce the micro-cavity effect.

As above-described, the over-coating film including depressed portions having the different slope angles depending on the pixels is formed in the organic light emitting device according to the present disclosure. Also, the pixel electrodes, the organic light emitting member, and the common electrode, which are disposed on the over-coating film, include the same surface as the curved surface of the over-coating film.

Accordingly, the red, green, and blue wavelengths may be effectively enhanced in the micro-cavity provided in each pixel.

Furthermore, because the depressed portions of the over-coating film are simultaneously formed when forming a plurality of contact holes in the over-coating film, micro-cavities substantially having different distances may be formed without additional processes, thereby improving the productivity and reducing the manufacturing cost.

While this device has been described in connection with what is presently considered to be practical exemplary embodiments, it is to be understood that the disclosure is not limited to the exemplary embodiments, but, on the contrary, is intended to cover various modifications and equivalent arrangements included within the spirit and scope of the appended claims.

What is claimed is:

1. An organic light emitting device comprising:
   a thin film transistor substrate including a plurality of thin film transistors;
   an over-coating film having depressed portions, the depressed portions having at least two different slope angles;
   a plurality of first electrodes formed on the over-coating film;
   an organic light emitting member formed on the first electrodes; and
   a second electrode formed on the organic light emitting member,
   wherein the over-coating film is formed on the thin film transistors and includes the depressed portions on at least two pixels of different colors, and the slope angles of the depressed portions forming a curved surface of the over-coating film are respectively different from each other depending on the colors of the pixels, so that maximum depths of the depressed portions vary according to the colors of the corresponding pixels;
   wherein the slope angles of the depressed portions increase as wavelengths of the pixel colors decrease;
   wherein the first electrodes include surfaces formed according to the curved surface of the over-coating film;
   wherein the organic light emitting member includes a surface formed according to the surface of the first electrodes; and
   wherein the second electrode includes a surface formed according to the surface of the organic light emitting member.

2. The organic light emitting device of claim 1, wherein when the slope angle of the depressed portion formed in a red pixel is $\theta_R$, the slope angle of the depressed portion formed in a green red pixel is $\theta_G$, and the slope angle of the depressed portion formed in a blue pixel blue pixel is $\theta_B$, the slope angles of the depressed portions satisfy the condition of $\theta_R < \theta_G < \theta_B$.

3. The organic light emitting device of claim 2, wherein the depressed portions are only disposed in the green pixel and the blue pixel.

4. The organic light emitting device of claim 1, wherein when the size of the depressed portion of the red pixel is $W_R$, the size of the depressed portion of the green pixel is $W_G$, and the size of the depressed portion of the blue pixel is $W_B$, the sizes of the depressed portions satisfy the condition of $W_R<W_G<W_B$.

5. The organic light emitting device of claim 4, wherein the depressed portions are only formed in the green pixel and the blue pixel.

6. The organic light emitting device of claim 1, wherein when a depth of the depressed portion of a red pixel is $D_R$, a depth of the depressed portion of a green pixel is $D_G$, and a depth of the depressed portion of a blue pixel is $D_B$, depths of the depressed portions satisfy the condition of $D_R<D_G<D_B$, and sizes of the depressed portions are identical regardless of color.

7. The organic light emitting device of claim 6, wherein the depressed portions are only formed in the green pixel and the blue pixel.

8. The organic light emitting device of claim 1, wherein the first electrodes are made of a transparent electrode material, and the second electrode is made of a reflective electrode material.

9. The organic light emitting device of claim 8, wherein at least one semi-transparent member is formed between the first electrodes and the over-coating film.

10. The organic light emitting device of claim 9, wherein the semi-transparent member includes Ag or AgMg.

11. The organic light emitting device of claim 9, wherein the semi-transparent member includes insulating materials having different refractive indexes, wherein the insulating materials having the different refractive indexes are alternately deposited.

12. The organic light emitting device of claim 11, wherein the semi-transparent member includes $SiNx/SiO_2/SiNx/SiO_2$ sequentially deposited on the over-coating film.

13. The organic light emitting device of claim 8, wherein at least one color filter is formed between the over-coating film and the thin film transistors.

14. The organic light emitting device of claim 1, wherein the first electrodes and the second electrode are made of a transparent electrode material.

15. The organic light emitting device of claim 14, wherein at least one semi-transparent member is formed between the first electrodes and the over-coating film.

16. The organic light emitting device of claim 15, wherein the semi-transparent member includes Ag or AgMg.

17. The organic light emitting device of claim 15, wherein the semi-transparent member includes insulating materials having different refractive indexes, wherein the insulating materials having the different refractive indexes are alternately deposited.

18. The organic light emitting device of claim 17, wherein the semi-transparent member includes $SiNx/SiO_2/SiNx/SiO_2$ sequentially deposited on the over-coating film.

19. The organic light emitting device of claim 14, wherein a passivation layer is formed on the second electrode, and at least one color filter is formed on the passivation layer.

20. A method for manufacturing an organic light emitting device, comprising:
forming lower formations including thin film transistors on a substrate;
forming an over-coating film having a curved surface on the lower formations;
forming first electrodes according to the curved surface on the over-coating film;
forming an organic light emitting member according to the curved surface on the first electrodes; and
forming a second electrode according to the curved surface on the organic light emitting member,
wherein the over-coating film comprises depressed portions having at least two different angles,
wherein the over-coating film includes the depressed portions on a least two pixels of different colors, and the slope angles of the depressed portions forming a curved surface the over-coating film are respectively different from each other depending on the colors of the pixels, so that maximum depths of the depressed portions vary according to the colors of the corresponding pixels;
wherein the slope angles of the depressed portions increase as wavelengths of the pixel colors decrease.

21. The method of claim 20, wherein
the angles of the depressed portions forming the curved surface are differently formed according to the pixel by using a mask including hole patterns having different sizes depending on the pixel.

22. The method of claim 20, wherein
the angles of the depressed portions forming the curved surface are differently formed according to the pixel by using a mask having different transmittance depending on the pixel.

23. The method of claim 20, wherein
the depressed portions are only disposed on the surface of the over-coating film in a green pixel and a blue pixel.

24. An organic light emitting device comprising:
a substrate;
a plurality of first electrodes formed on the substrate;
a first organic light emitting member formed in a first group among the first electrodes, and having a first depressed portion;
a second organic light emitting member formed in a second group that is different from the first group among the first electrodes, and having a second depressed portion; and
a second electrode formed on the first organic light emitting member and the second organic light emitting member,
wherein a wavelength of a color of the first organic light emitting member is smaller than a wavelength of a color of the second organic light emitting member; and
wherein a slope angle of the first depressed portion is larger than a slope angle of the second depressed portion.

25. The organic light emitting device of claim 24, further comprising
a third organic light emitting member formed in a third group that is different from the first group and the second group among the first electrodes.

26. The organic light emitting device of claim 25, wherein the first organic light emitting member emits blue light, the second organic light emitting member emits green light, and the third organic light emitting member emits red light.

27. The organic light emitting device of claim 24, further comprising:
at least one signal line formed on the substrate;
at least one thin film transistor formed on the substrate; and
an over-coating film covering the signal line and the thin film transistor, having a surface with protrusions and depressions forming the first and second depressed portions,
wherein the first and second depressed portions of the first and second organic light emitting members are respectively formed due to the surface of the over-coating film.

* * * * *